United States Patent [19]
Maier

[11] Patent Number: 4,596,045
[45] Date of Patent: Jun. 17, 1986

[54] INPUT CIRCUIT FOR TELEVISION RECEIVER

[75] Inventor: Gerhard Maier, Dauchingen, Fed. Rep. of Germany

[73] Assignee: Deutsche Thomson-Brandt GmbH, Villingen, Fed. Rep. of Germany

[21] Appl. No.: 610,611

[22] Filed: May 15, 1984

[30] Foreign Application Priority Data

May 19, 1983 [DE] Fed. Rep. of Germany ....... 3318197

[51] Int. Cl.$^4$ .............................................. H04B 1/16
[52] U.S. Cl. .................................... 455/189; 455/133; 455/140
[58] Field of Search ............... 455/133, 142, 140, 143, 455/144, 180, 188, 189; 334/1, 47.18; 358/188

[56] References Cited

U.S. PATENT DOCUMENTS

| | | | |
|---|---|---|---|
| 3,268,816 | 8/1966 | Featherston | 455/133 |
| 3,696,302 | 10/1972 | Gossard | 455/189 |
| 4,227,156 | 10/1980 | Mattfeld | 455/144 |
| 4,379,271 | 4/1983 | Lehmann | 455/188 |

FOREIGN PATENT DOCUMENTS

| | | |
|---|---|---|
| 1108264 | 6/1961 | Fed. Rep. of Germany . |
| 3014983 | 10/1982 | Fed. Rep. of Germany . |
| 3318197 | 10/1984 | Fed. Rep. of Germany . |
| 83147 | 7/1981 | Japan ................................. 455/133 |

OTHER PUBLICATIONS

Farbfernsehtachnik, B. Morgenstern, Teubner, Stuttgart, 1977, p. 134.
Nachrichtenelektronik, Europa-Lehrmittel No. 32254, Wuppertal, 116–124.

*Primary Examiner*—Jin F. Ng
*Attorney, Agent, or Firm*—Horst M. Kasper

[57] ABSTRACT

An input circuit is provided for a television receiver for amplifying and transforming the input signals into an intermediate frequency signal. The output of the mixers is fed via intermediate-frequency bandpass filters to respective decoupling diodes, which are switched on depending on the selected receiver frequency range. The output of the decoupling diodes is fed to an impedance transformer such as an emitter follower and its output in turn is entered into an intermediate-frequency amplifier.

14 Claims, 2 Drawing Figures

INPUT CIRCUIT FOR TELEVISION RECEIVER

DESCRIPTIOM

BACKGROUND OF THE INVENTION

1. Field of the Invention

The present invention relates to an electronic circuit for television receivers for amplification and transformation of very high frequency and of ultra high frequency signals into an intermediate-frequency signal with a high frequency input stage provided for each frequency region, a mixing stage, a bandpass filter tuned to the intermediate frequency and an intermediate frequency amplifier.

2. Brief Description of the Background of the Invention Including Prior Art

Such circuits for signal processing in television receivers are generally known. The signals decoupled via the intermediate frequency bandpass filters are directly fed to the intermediate-frequency amplifier. However, this is associated with several disadvantages, which are expressed in that during production and after the electrical connection of the tuner to the intermediate-frequency amplifier both have to be retuned to the intermediate-frequency because of the different output or, respectively, input frequencies. Also a repair requires a new balancing and tuning, but this is frequently not possible in view of a lack of the necessary testing equipment and this becomes very expensive. If the tuning and balancing is not performed, then the bad matching between tuner and intermediate-frequency amplifier causes more or less reflections of the signal.

SUMMARY OF THE INVENTION

1. Purposes of the Invention

It is an object of the present invention to provide an improved and non-critical matching and adaptation of the tuner to the intermediate-frequency amplifier in a television receiver, which is not sensitive to the individual components employed.

It is another object of the present invention to provide a television receiver circuit where the first intermediate-frequency filter in the tuner becomes independent of the load at the output of the tuner and where the load connected to the intermediate-frequency amplifier becomes independent of the load applied to the input.

It is a further object of the present invention to provide a television receiver where the output of the intermediate-frequency bandpass filter is transformed in order to match and render non-critical the input impedance of the following stage.

These and other objects and advantages of the present invention will become evident from the description which follows.

2. Brief Description of the Invention

The present invention provides a circuit for television receivers which comprises a first switch connected to a first power source, a first amplifier for an incoming ultra high frequency signal, a first mixing stage connected to the first amplifier, a first intermediate-frequency bandpass filter connected to the first mixing stage, a first decoupling diode connected to the output of the first intermediate-frequency bandpass filter and to the switch for being turned on and off depending on the switch position, a second switch connected to a second power source for connecting the second power source, a second amplifier for an incoming very high frequency signal, a second mixing stage connected to the second amplifier, a second intermediate-frequency bandpass filter connected to the second mixing stage, a second decoupling diode connected to the output of the second intermediate-frequency bandpass filter and to the second switch for being turned on and off depending on the second switch position, an impedance transformer connected to the first decoupling diode and to the second decoupling diode, and an intermediate-frequency amplifier connected to the output of the impedance transformer.

The impedance transformer can be provided by an emitter follower transistor circuit. An oscillator stage can be connected to the second mixer stage, where the very high frequency signal is transformed into an intermediate-frequency signal. The oscillator can be driven by a transistor. A resistor can connect the output of the decoupling diodes to ground. A third decoupling diode can be connected in series to the first decoupling diode to reinforce the decoupling. The first intermediate-frequency bandpass filter and the second intermediate-frequency bandpass filter preferably include an inductance in series connection. The first mixer stage and the second mixer stage can employ a transistor as mixing element.

There is also provided a method for amplification and conversion of high frequency electromagnetic waves in two frequency ranges which comprises feeding the high frequency electromagnetic waves to a first amplifier or to a second amplifier depending on the frequency range to which they belong, feeding the amplified signal to a respective first mixing stage or second mixing stage for generating an intermediate-frequency, filtering the output of the mixing stage in a respective first intermediate-frequency bandpass filter or second intermediate-frequency bandpass filter, switching a respective first decoupling diode or a second decoupling diode on and off depending on which of the frequency regions is selected for passing the respective output from the intermediate-frequency bandpass filter, matching the decoupling diode output signal to the input impedance of an impedance transformer connected to the first decoupling diode and to the second decoupling diode, and amplifying the output of the impedance transformer with an intermediate-frequency amplifier connected to the output of the impedance transformer.

An oscillator frequency can be generated in an oscillator stage connected to the second mixer stage, where the very high frequency signal is transformed into an intermediate-frequency signal. The oscillator can be driven by a transistor. Part of the output of the decoupling diodes can be dissipated via a resistor connected to ground. The decoupling can be reinforced by connecting a third decoupling diode connected in series to the first decoupling diode.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

In accordance with the present invention there is provided a circuit arrangement for a television receiver apparatus for amplifying and converting of very high frequency (VHF-) and ultra high frequency (UHF-) signals into an intermediate-frequency signal for each frequency region with a high frequency input stage, a mixing stage, a bandpass filter tuned to the intermediate frequency, and an intermediate frequency amplifier wherein the intermediate frequency amplifier 9 is connected to the outputs of the intermediate frequency bandpass filters via an impedance transformer such that the outputs of the intermediate-frequency bandpass filter 5,8 are applied to the input of the impedance transformer via decoupling diodes alternatingly turned on by the operating voltages for the VHF/UHF-stages 2, 4, 3, 6, 7.

Figure 1:
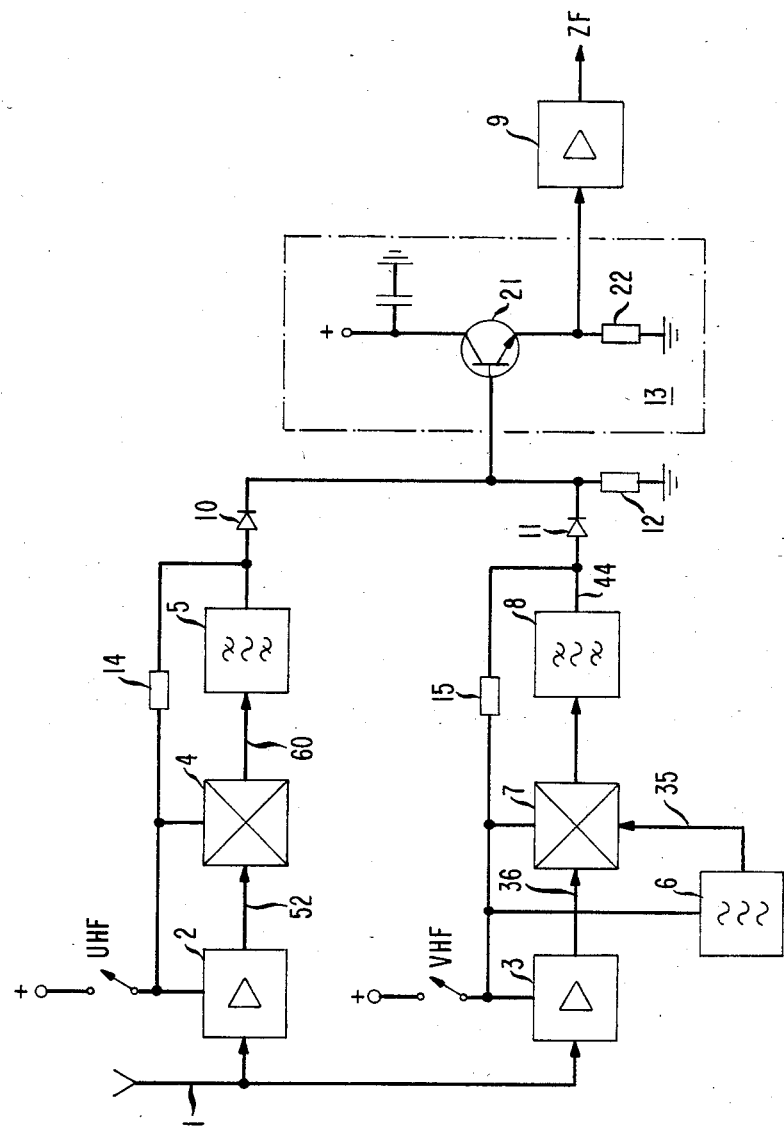
FIG. 1 is a view of a block circuit diagram of the television receiver.

Referring now to FIG. 1 there is shown an antenna from which the high frequency signals pass to the amplifiers 2 for the signals in the UHF-frequency region and 3 for the signals in the VHF-frequency region. The signals are transformed into intermediate frequency signals in a conventional way. This occurs for the UHF-channel based on the self-oscillating mixing stage 4, the intermediate-frequency output voltage of which is fed to an intermediate-frequency bandpass filter 5. The VHF-signal is transformed into the intermediate frequency in the mixing stage 7 with the aid of an oscillator frequency generated in the oscillator stage 6 and then the intermediate-frequency signal is fed to the intermediate-frequency bandpass filter. In accordance with the invention, the intermediate-frequency signals are not fed directly to the first intermediate-frequency amplifier 9, but they are fed via decoupling diodes 10 and 11 to a resistor 12 connected to ground and the resistor is connected to the input of an impedance transformer 13. The output of this impedance transformer is connected to the first intermediate-frequency amplifier 9. The impedance transformer is provided as an emitter-follower stage employing a transistor 21 and the output signal is taken from the emitter, which is connected via a resistor 22 to ground. The UHF- or, respectively, VHF- intermediate-frequency signals are switched on via diodes 10 and 11 turned on with the supply voltage for the HF-stages of the two channels via series resistors 14 and 15.

Figure 2:
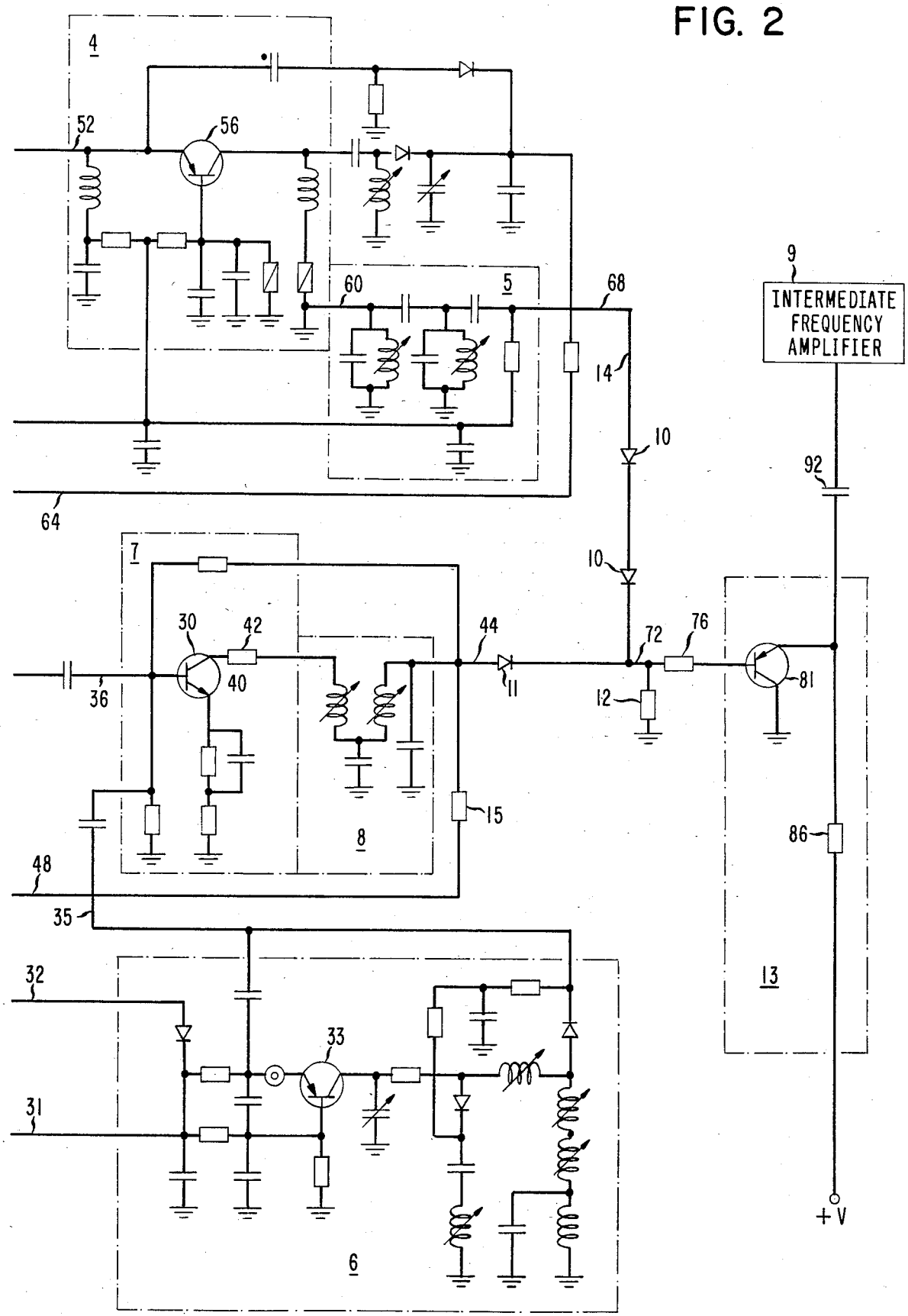
FIG. 2 is a view of a partial circuit diagram of the television receiver including oscillator, mixer and intermediate-frequency band pass filter.

FIG. 2 shows a preferred embodiment as a partial circuit diagram including the oscillator circuit 6, the mixing stages 4, 7 and the intermediate-frequency bandpass filters 5, 8 as well as the impedance transformer 13. The input to the oscillator circuit 6 is provided via lines 31 and 32. The oscillator circuit is driven by a transistor 33. The output of the oscillator circuit is fed via line 35 to the input of the mixer stage 7. Another input 36 to the mixer stage is connected to the output of a second amplifier 3 (compare FIG. 1). The oscillator frequency and the very high frequency signal are fed to the base of transistor 38 and the collector output 40 of transistor 38 is fed via a resistor 42 to the intermediate-frequency bandpass filter 8. This filter comprises inductances and the output 44 of the filter 8 is fed to the diode 11 and from there to line 72. The diode can be switched into a conducting state via line 48 and resistor 15 which are connected via a switch to the voltage supply.

The UHF-signal is fed to the mixer stage 4 via line 52 and is mixed in transistor 56. The output of mixer stage 4 is fed via line 60 to the intermediate-frequency bandpass filter 5, which contains filter circuit elements including capacitances and inductors.

The power to the mixer stage 4 and to the filter 5 is provided via line 64 and resistor 14 and a switch is provided for selecting the UHF-channels. The output of the intermediate-frequency bandpass filter runs via two diodes 10 connected in series also to line 72. The signal of line 72 passes through a resistor 76 to the base of transistor 81. Transistor 81 forms the center of an impedance transformer, which matches the output of the intermediate-frequency bandpass filters to the input of the intermediate frequency amplifier 9. The collector of transistor 81 is connected to ground and the emitter is connected via resistor 86 to a voltage supply. The output signal is taken from the emitter and fed via a capacitor 92 to the intermediate-frequency amplifier 9.

The introduction of the impedance transformer 13 employing a real emitter resistor 22 provides that the input of the intermediate-frequency amplifier 9 is always terminated with a constant value.

It will be understood that each of the elements described above, or two or more together, may also find a useful application in other types of high frequency receiver system configurations and television signal processing procedures differing from the types described above.

While the invention has been illustrated and described as embodied in the context of an input circuit for a television receiver, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A circuit for television receivers comprising
   a first power source;
   a first switch connected to the first power source for connecting the first power source;
   a first amplifier for an incoming ultra high frequency signal;
   a first mixing stage connected to the first amplifier;
   a first intermediate-frequency bandpass filter connected to the first mixing stage;
   a first decoupling diode connected to the output of the first intermediate-frequency bandpass filter and to the switch for being turned on and off depending on the switch position;
   a second power source;
   a second switch connected to the second power source for connecting the second power source;
   a second amplifier for an incoming very high frequency signal;
   a second mixing stage connected to the second amplifier;

a second intermediate-frequency bandpass filter connected to the second mixing stage;

a second decoupling diode connected to the output of the second intermediate-frequency bandpass filter and to the second switch for being turned on and off depending on the second switch position;

an impedance transformer connected to the first decoupling diode and to the second decoupling diode; and an intermediate-frequency amplifier connected to the output of the impedance transformer.

2. The circuit for television receivers according to claim 1 wherein the impedance transformer is provided by an emitter follower transistor circuit.

3. The circuit for television receivers according to claim 1 further comprising an oscillator stage connected to the second mixer stage, where the very high frequency signal is transformed into an intermediate-frequency signal.

4. The circuit for television receivers according to claim 3 wherein the oscillator stage is driven by a transistor.

5. The circuit for television receivers according to claim 1 further comprising a resistor connecting the output of the decoupling diodes to ground.

6. The circuit for television receivers according to claim 1 further comprising a third decoupling diode connected in series to the first decoupling diode to reinforce the decoupling.

7. The circuit for television receivers according to claim 1 wherein the second intermediate-frequency bandpass filter include an inductance in series connection between an input and an output of the bandpass filter.

8. The circuit for television receivers according to claim 1 wherein the first mixer stage and the second mixer stage employ a transistor as mixing element.

9. A method for amplification and conversion of high frequency electromagnetic waves in two frequency ranges comprising feeding the high frequency electromagnetic waves to a first amplifier or to a second amplifier depending on the frequency range to which they belong;

feeding the amplified signal either to a respective first mixing stage or to a respective second mixing stage for generating an intermediate-frequency;

filtering the output of the mixing stage in a respective first intermediate-frequency bandpass filter or second intermediate-frequency bandpass filter;

switching a respective first decoupling diode or second decoupling diode on and off depending on which one of a possible frequency region is selected for passing the respective output from the intermediate-frequency bandpass filter;

matching the decoupling diode output signal to the input impedance of an impedance transformer connected to the first decoupling diode and to the second decoupling diode; and amplifying the output of the impedance transformer with an intermediate-frequency amplifier connected to the output of the impedance transformer.

10. The method for amplification and conversion of high frequency electromagnetic waves in two frequency ranges according to claim 9 wherein said filtering step includes coupling the output of the mixer stage through an inductance which is coupled in series between an input and an output of the second intermediate-frequency bandpass filter.

11. A method for amplification and conversion of high frequency electromagnetic waves in two frequency ranges according to claim 9 generating oscillator frequency in an oscillator stage connected to the second mixer stage, where the very high frequency signal is transformed into an intermediate-frequency signal.

12. The method for amplification and conversion of high frequency electromagnetic waves in two frequency ranges according to claim 11 further comprising driving the oscillator stage by a transistor.

13. A method for amplification and conversion of high frequency electromagnetic waves in two frequency ranges according to claim 9 further comprising dissipating part of the output of the decoupling diodes via a resistor connected to ground.

14. A method for amplification and conversion of high frequency electromagnetic waves in two frequency ranges according to claim 9 further comprising reinforcing the decoupling by connecting a third decoupling diode connected in series to the first decoupling diode.

* * * * *